United States Patent [19]

Weckler

[11] Patent Number: 4,807,293

[45] Date of Patent: Feb. 21, 1989

[54] LOUDSPEAKER HOUSING

[76] Inventor: Joachim Weckler, Im Berggarten 4, D-6309 Rockenberg, Fed. Rep. of Germany

[21] Appl. No.: 114,783

[22] Filed: Oct. 30, 1987

[30] Foreign Application Priority Data

Nov. 6, 1986 [DE] Fed. Rep. of Germany ....... 3637910

[51] Int. Cl.[4] ................................................ H05K 5/00

[52] U.S. Cl. .................................... 381/159; 181/152; 181/156

[58] Field of Search ............... 381/159, 156, 153, 160, 381/154, 158; 181/152, 156, 151, 199

[56] References Cited

U.S. PATENT DOCUMENTS

| | | | |
|---|---|---|---|
| 2,224,919 | 12/1940 | Olson | 181/152 |
| 2,751,997 | 6/1956 | Gately, Jr. | 181/152 |
| 2,822,884 | 2/1958 | Simpson | 181/156 |
| 2,866,513 | 12/1958 | White | 181/156 |
| 2,971,598 | 2/1961 | Sieler | 181/152 |
| 4,173,266 | 11/1979 | Pizer et al. | 181/152 X |
| 4,524,845 | 6/1985 | Perrigo | 181/152 |
| 4,524,846 | 6/1985 | Whitby | 181/152 |
| 4,629,030 | 12/1986 | Ferralli | 181/156 X |

FOREIGN PATENT DOCUMENTS

| | | | |
|---|---|---|---|
| 2832041 | 1/1980 | Fed. Rep. of Germany | 181/156 |
| 0140393 | 11/1980 | Japan | 181/152 |
| 0829553 | 3/1960 | United Kingdom | 181/156 |

*Primary Examiner*—Eugene R. LaRoche
*Assistant Examiner*—Seung Ham
*Attorney, Agent, or Firm*—Steele, Gould & Fried

[57] ABSTRACT

The invention concerns a loudspeaker housing (1), particularly for rendition of the deep and middle tone ranges, having a loudspeaker (27) and a folded flare (14; 20, 21, 15, 16; 6). The front side of this loudspeaker housing (1) has an upper area, in which the loudspeaker (27) is located, as well as a lower area, which represents the end of the folded flare. The tones with higher frequency are thus radiated directly from the loudspeaker (9, 27) forwards, while the low frequency tones are radiated via the folded flare, whereby this flare guides the sound waves generated by the loudspeaker (9, 27) towards the rear wall of the loudspeaker housing (1). Hereby, the flare is formed by an opening (18) in an intermediate wall (17), an arch (14), two guide spacers (20, 21), two arches (15, 16) above the guide spacers (20, 21), and one exponentially curved wall (6) (FIG. 2).

18 Claims, 2 Drawing Sheets

LOUDSPEAKER HOUSING

BACKGROUND OF THE INVENTION

Loudspeaker housings are needed for numerous purposes. Most frequently, they are used in HiFi technology, namely in the rendition of radio, record, audio tape, compact disc, and other tone information. Another application area for loudspeaker housings is amplified rendition of live music produced by orchestras or smaller bands.

The reproduction of acoustic signals in the deep and medium tone range is of particular interest for amplified rendition of live music or of discoteque music. Hereby, the deep tones must be represented with relatively high acoustic pressure and great impulse accuracy. As a rule, loudspeaker housings with relatively large dimensions are needed for this purpose.

A loudspeaker housing for medium tone range rendition is already known, in which the sound generation occurs through a loudspeaker with a conical shape which is combined with a flare (DE-OS No. 28 05 253). However, this loudspeaker housing is very voluminous.

In order to decrease the space requirements of loudspeaker housings with flare, it is already known how to fold the flare (DE-OS No. 29 03 005). This includes a loudspeaker exponential to the folsing and with a forked sound path for the directions of the sound waves, providing at least one electroacoustic converter to a space into which the sound waves are propagated. However, it is a disadvantage of this loudspeaker housing that the loudspeaker connot project any direct sound but that the entire sound projection goes through the folded flare. This dampens the high frequency tones significantly.

Furthermore, a loudspeaker housing is known which has at least one loudspeaker, placed on the front wall of the housing. The loudspeaker housing is hereby subdivided into one upper and one lower chamber by means of a transversal wall, whereby the first chamber contains the loudspeaker at the front side, and the second chamber is open to the front side and connected to the first chamber via a slot, narrow in relation to the depth of the loudspeaker housing and located at the back side of the loudspeaker housing. This provides no subdivision into a front and a rear chamber by means of a longitudinal wall, so that the resulting sound conduction path is relatively short, which is unfavorable for the effect of the rendition of the deep base tones (DE-OS No. 32 42 722).

Finally, another loudspeaker housing is also known, which has intermediate walls in order to achieve an improved helical sound conduction path from the loudspeaker to the trumpet, whereby the sound conveyance path is subdivided into two equally large, preferrably mutually symmetrical sound conduction branches which are reunited in front of the trumpet (DE-OS No. 21 16 992). The subdivision into two sound conduction paths occurs immediately behind the loudspeaker. In addition, the sound conduction channels are on horizontal planes so that the sound propagation goes mainly from the front to the rear wall, or from the rear to the front, which requires relatively high costs for material and work in order to obtain a corresponding length of the flare.

OBJECTS OF THE INVENTION

The purpose of the invention is to create a small loudspeaker housing with maximum sufficiency, with a folded flare, by means of which direct sound propagation is also possible.

The advantage gained with the invention consists particularly therein that on one hand, the loudspeaker housing is very simply structured and, on the other hand, the mechanical stability of the flare is very high. This is important in order to avoid co-vibration of flare components which might cause interferences and resonances. By means of the invention, it is possible to reproduce deep tones to below 40 Hz with a high degree of effectiveness, near linear frequency response, and high impulse trueness. But tones up to 3000 Hz can also be transmitted via the loudspeaker housing according to the invention without occurrence of the undifferentiated sinusoidal sound which frequently occurs in loudspeaker housings with sound projection exclusively via a folded flare, since the projection of the higher tones comes direclty forwards from the loudspeaker. If a coaxial loudspeaker is used as sound projection element, it is possible to transmit the entire acoustic frequency spectrum with the loudspeaker housing.

Due to the particular execution of the loudspeaker housing, the sound velocity from the loudspeaker to the flare is increased so that the projection resistance is increased, which, in turn, means a high degree of effectiveness for the base tones and, simultaneously, mimimum deflection of the membranes. The distortion due to the speed transformation of the sound is thus equalized by the very small amplitude of the loudspeaker membrane. In addition, the intermodulation distortions are reduced due to the small amplitude of the loudspeaker membrane.

SUMMARY OF THE INVENTION

This invention relates to a loudspeaker housing. The invention concerns a loudspeaker housing, particularly for rendition of the deep and medium tone range, with a front side and a back wall as well as with an intermediate wall arranged between front side and back wall, further, with a sound projection element, whereby the back side of this sound projection element is acoustically connected to a folded flare which projects sound basically in the same direction as the front side of the sound projection element and the projection opening of which is located below or above the sound projection element.

BRIEF DESCRIPTION OF THE DRAWINGS

An example of the invention is represented in the drawing and will be described hereafter in greater detail. The following is shown.

DETAILED DESCRIPTION OF THE PREFERRED EMBODIMENTS

Figure 1:
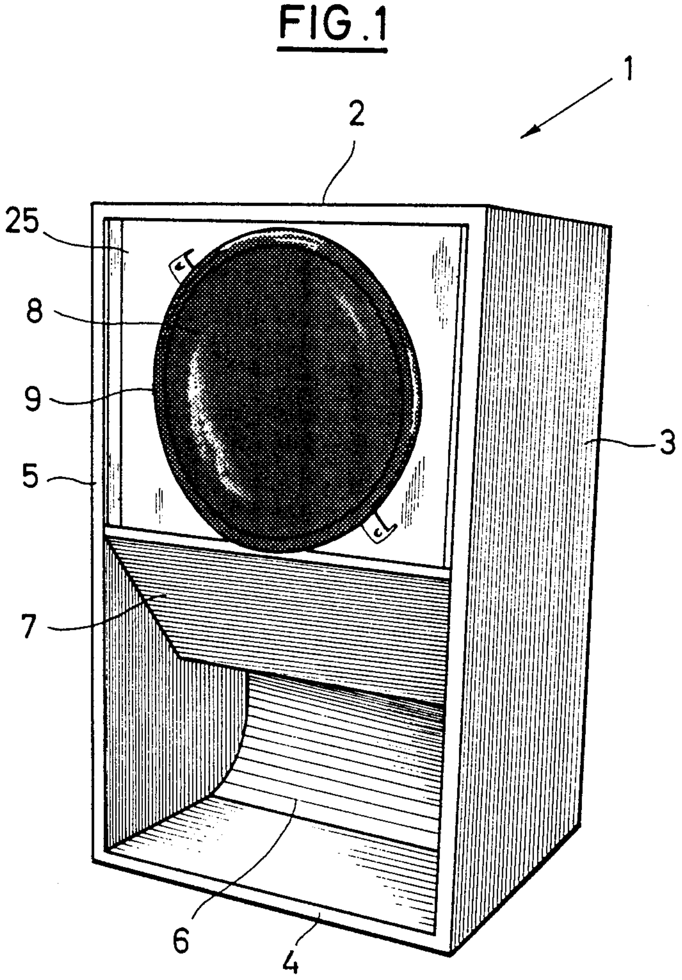
FIG. 1 a perspective view of the loudspeaker housing according to the invention.

FIG. 1 shows a loudspeaker housing 1 which basically has the shape of a parallelepipede and is limited by the side walls 3,5 as well as by the upper wall 2 and the lower wall 4. The front of the loudspeaker housing 1 is divided into one upper and one lower part. A loudspeaker membrane 8 is located in the upper part 25; it has a circumferential bead 9, while in the lower part, a wall 6 can be seen, running exponentially from bottom front to rear top, above which is located a plane wall 7 reaching from top front to rear bottom. During operation, the high tones, i.e. the tones in the medium tone range, are projected directly into the room by the membrane 8. By contrast, the deep tones exit between the wall 6 and the wall 7. The two walls 6, 7 combine to form part of a folded flare.

Figure 2:
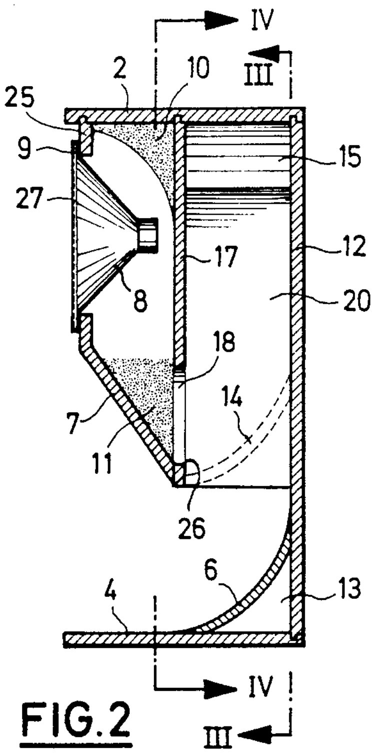
FIG. 2 a first longitudinal section through the loudspeaker housing, namely seen from one side.

FIG. 2 shows a vertical section through the loudspeaker housing 1, namely parallel to the side wall 3. Here, one can again recognize the lower end of the folded flare which is formed by the walls 6 and 7. The wall 6 is supported by several spacers, of which FIG. 2 shows only the spacer 13, which is supported by the lower wall 4 and the rear wall 12. Above the wall 6, there is an arch which also exponentially designed and leads to the rear wall 12. The arch 14 is represented by a dashed line, since it is covered by a spacer 20.

An intermediate wall 17 begins at the connection point 26 between the wall 7 and the arch 14, running upwards parallel to the rear wall 12 and abutting the upper wall 2. This intermediate wall 17 has an opening 18 which represents the acoustic connection between a loudspeaker 27 and the flare end 6, 7, 4. The upper end of the spacer 20 is covered by an arch 15. In the space between the intermediate wall 17, the loudspeaker 27, the upper wall 2, and the wall 7, some areas 10, 11 are lined with foam material in order to facilitate improved sound conveyance.

Figure 3:
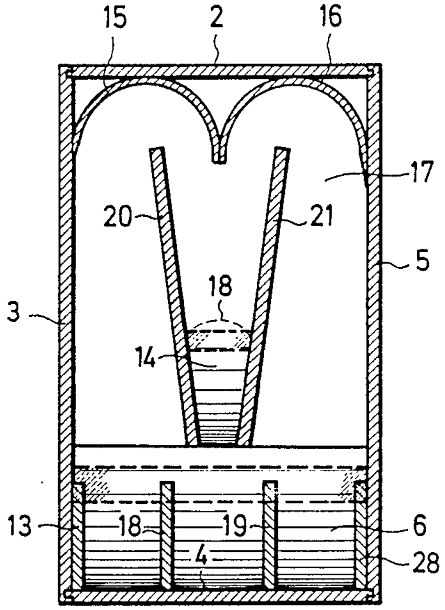
FIG. 3 a second longitudinal section through the loudspeaker housing, namely seen from the rear FIG. 4 a third longitudinal section through the loudspeaker housing, namely seen from the front.

FIG. 3 shows a section of the loudspeaker housing 1 parallel to the rear wall 12, namely seen from the rear. Hereby, one recognizes four spacers 13, 18, 19, 28, which support the exponentially curved part 6 of the folded flare. The rear side of the exponentially curved arch 14 can also be recognized. Abutting the intermediate wall 17 with its opening 18 are the two guide spacers 20, 21 which are angled against one another and enclose the opening 18 as well as the arch 14. Since the opening is not visible, the upper edge of it has been indicated by means of a dashed line.

In the loudspeaker housing 1, the sound conveyance occurs so that the sound waves aimed towards the intermediate wall 17 are first guided by the foam material lining 10, 11 and then pass through the hole 18, from which they are conducted between the spacers 20, 21 by means of the arch 14.

Hereafter, they are guided around the upper ends of the spacers 20, 21 by means of the arches 15, 16, and finally, they reach the open via the exponential wall 6 and the wall 7.

Figure 4:
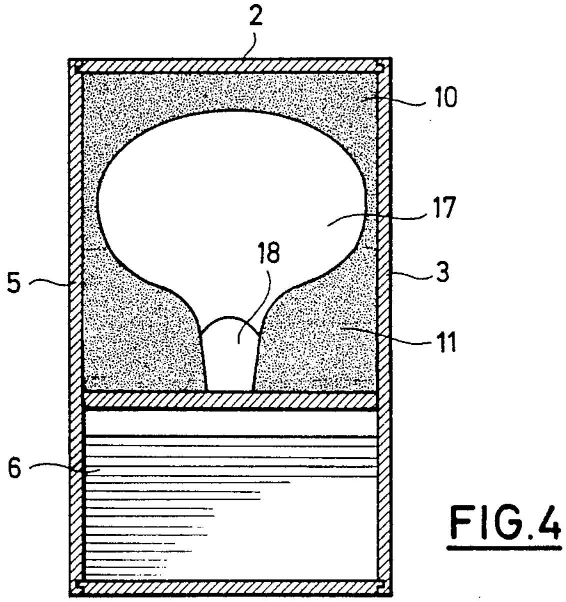

FIG. 4 shows yet another vertical section through the loudspeaker housing 1, namely parallel to the walls 17 and 25. In this representation, the partial filling of the space between the walls 17 and 25 is clearly recognizable.

The folding points of the flare are always exponentially or hyperbolically designed. The first folding point is formed by the arch 14, while the second folding point is formed by the arches 15 and 16, and the third folding point by the wall 6.

Due to the specific design of the folding points, partial reflections at unstable points are avoided. As is known, such partial reflections cause unfavorable frequency response and low efficiency.

A precise design of the folding points is possible by means of several layers of plywood glued on top of one another, or by means of pieces of plastic piping. A lining of hard foam is also conceivable, whereby the hard foam can be coated with a layer that reflects particularly well.

The inclusion of the intermediate wall 17 in conjunction with the two guide spacers 20, 21 gives the loudspeaker housing an exceptionally stable form, since the abovementioned guide spacers, e.g. of plywood, have fixed connections both with the intermediate wall 17 and with the rear wall 12. The high mechanical stability prevents the occurrence of interference, and the structure makes it possible to minimize the depth of the loudspeaker housing.

The hard foam lining of the pressure chamber between the wall 25 and the intermediate wall 17 causes optimum guidance of the rearward sound portion to the neck of the flare, which is formed by the opening 18. The sound conductance can be further improved if the surface of the hard foam has a suitable coating.

As can be seen from FIGS. 2 and 4, the upper part of the hard foam, 10, 11 surrounds an spherical cut-out. However, other spaces, e.g. of a parabolic shape, can also be enclosed. The lower part of the hard foam has the shape of the Verhülst logistic function.

It should be understood that the invention can also be executed with several loudspeakers and that these loudspeakers need not be electrodynamic loudspeakers.

I claim:

1. Loudspeaker housing, particularly for the radiation of deep and middle tone ranges, with a front side and a rear wall as well as with an intermediate wall located between the front side and the rear wall and being smaller than said rear wall, further with a sound emitting element provided at the front side, wherein a rear side of said sound emitting element is in an acoustic connection with a folded flare comprising two sound guidance branches, branches of which are equidistant with respect to the rear wall, said flare basically emitting sound in the same direction as the front side of the sound emitting element and a radiating opening of the folded flare is located at one location above or below the sound emitting element, characterized in that between the rear wall and the intermediate wall generally vertical spacers are disposed, each of them extending from said rear wall to said intermediate wall, upper ends of the vertical spacers are oriented towards respective sound deflection devices, each of said sound deflection devices deflecting the sound in a different direction, and lower ends of the vertical spacers enclose an opening in the intermediate wall.

2. Loudspeaker housing according to claim 1, characterized in that said branches ending in a further opening.

3. Loudspeaker housing according to claim 1, characterized in that from a lower side of the opening, an arch leads to the rear wall, the width of said arch is adapted to span the distance between the spacers.

4. Loudspeaker housing according to claim 1, characterized in that the sound deflection devices are shaped as arches.

5. Loudspeaker housing according to claim 3, characterized in that the arches are shaped as an exponential or a hyperbolic shape.

6. Loudspeaker housing according to claim 2, characterized in that the radiating opening is formed by an exponentially or a hyperbolically curved wall.

7. Loudspeaker housing according to claim 6, characterized in that one end of the curved wall begins at a bottom wall of the housing, while the other end of the curved wall begins on the rear wall and at a level of a lower end of the intermediate wall.

8. Loudspeaker housing according to claim 1, characterized in that the front wall is shorter than the intermediate wall and that respective lower ends of the front and intermediate walls are connected by an additional wall.

9. Loudspeaker housing according to claim 1 characterized in that the two vertical spacers slope towards one another at a specific angle.

10. Loudspeaker housing according to claim 1, characterized in that the two vertical spacers are in mirror-image symmetry with one another, whereby a symmetry axis runs parallel to a side wall of the loudspeaker housing.

11. Loudspeaker housing according to claim 1, characterized in that a distance between the ends of the vertical spacers and the sound deflection devices amounts to approximately one fifth or one fourth of the length of one of the vertical spacers.

12. Loudspeaker housing according to claim 1, characterized in that a distance between the lower ends of the vertical spacers is approximately half of a distance between the upper ends of the vertical spacers.

13. Loudspeaker housing according to claim 1, characterized in that an electrodynamic loudspeaker is attached to the front wall in such a manner that a magnet portion of said loudspeaker is located between the front wall and the intermediate wall.

14. Loudspeaker housing according to claim 1, characterized in that a sound pressure space between the front wall and the intermediate wall is lined with a hard foam-like acoustic material in such a manner that a sound radiated by a loudspeaker membrane in a direction towards the intermediate wall is guided in a direction towards the opening in the intermediate wall.

15. Loudspeaker housing according to claim 14, characterized in that a space surrounded by the hard foam has the shape of a calotte shell.

16. Loudspeaker housing according to claim 14, characterized in that the hard foam has a sound-reflecting layer on a side which is oriented towards the loudspeaker (9, 27).

17. Loudspeaker housing according to claim 14, characterized in that a lower portion of the hard foam has a shape of a Verhulst- logistic function.

18. Loudspeaker housing according to claim 6, characterized in that the front wall (25) is shorter than the intermediate wall (17) and that the lower ends of the front and intermediate wall are connected by an additional wall (7), and wherein the hyperbolically or exponentially curved wall (6) and the wall (7), which connects the lower ends of the front and intermediate walls (17, 25) combine to form an exit which at least approximates the hyperbolic or exponential shape.

* * * * *